United States Patent [19]
Kingsley

[11] Patent Number: 6,144,262
[45] Date of Patent: Nov. 7, 2000

[54] CIRCUIT FOR MEASURING SIGNAL DELAYS OF ASYNCHRONOUS REGISTER INPUTS

[75] Inventor: Christopher H. Kingsley, San Jose, Calif.

[73] Assignee: Xilinx, Inc., San Jose, Calif.

[21] Appl. No.: 09/360,288

[22] Filed: Jul. 22, 1999

Related U.S. Application Data

[63] Continuation-in-part of application No. 09/235,419, Jan. 20, 1999, Pat. No. 6,075,418, which is a continuation-in-part of application No. 09/115,204, Jul. 14, 1998, which is a continuation-in-part of application No. 08/710,465, Sep. 17, 1996, Pat. No. 5,790,479.

[60] Provisional application No. 60/107,765, Nov. 9, 1998.

[51] Int. Cl.[7] .......................... G01R 27/28; G04F 10/02; H03B 5/02; H03H 11/26
[52] U.S. Cl. ............................ 331/57; 324/617; 324/633; 327/265; 365/201; 368/118; 368/120; 371/21.4
[58] Field of Search ............................. 331/57; 324/617, 324/633; 327/265; 365/201; 368/118, 120; 371/21.4

[56] References Cited

U.S. PATENT DOCUMENTS

| | | | |
|---|---|---|---|
| Re. 34,363 | 8/1993 | Freeman | 307/465 |
| 3,603,746 | 9/1971 | Heick et al. | 179/175.2 |
| 4,510,429 | 4/1985 | Squire | 318/696 |
| 4,792,932 | 12/1988 | Bowhers et al. | 368/113 |
| 4,795,964 | 1/1989 | Mahant-Shetti et al. | 324/60 |
| 4,878,209 | 10/1989 | Bassett et al. | 368/113 |
| 4,890,270 | 12/1989 | Griffith | 368/113 |
| 5,048,064 | 9/1991 | Rutherford | 377/20 |
| 5,083,299 | 1/1992 | Schwanke et al. | 368/113 |
| 5,181,191 | 1/1993 | Farwell | 368/113 |
| 5,294,559 | 3/1994 | Malhi | 437/40 |
| 5,351,211 | 9/1994 | Higeta et al. | 365/189.05 |
| 5,581,738 | 12/1996 | Dombrowski | 395/500 |
| 5,606,567 | 2/1997 | Agrawal et al. | 371/22.4 |
| 5,625,288 | 4/1997 | Snyder et al. | 324/158.1 |
| 5,845,233 | 12/1998 | Fishburn | 702/108 |
| 5,923,676 | 7/1999 | Sunter et al. | 371/22.5 |
| 5,973,976 | 10/1999 | Sato | 365/222 |

OTHER PUBLICATIONS

"The Programmable Logic Data Book", 1998, available from Xilinx, Inc., 2100 Logic Drive, San Jose, California 95124, pp. 4–5 to 4–40.

Application Note from Xilinx, Inc., "Efficient Shift Registers, LFSR Counters, and Long Pseudo–Random Sequence Generators," by Peter Alfke, Jul. 7, 1996.

"Signal Delay in RC Tree Networks," IEEE Transactions on Computer–Aided Design, vol. CAD–2, No. 3, Jul. 1983, pp. 202–211.

*Primary Examiner*—Siegfried H. Grimm
*Attorney, Agent, or Firm*—Arthur J. Behiel, Esq.; Edel M. Young

[57] ABSTRACT

A circuit measures a signal propagation delay through a series of memory elements on a programmable logic device. In one embodiment, a number of latches are configured in series. Each latch is initialized to store a logic zero. The first latch is then clock-enabled so that the output of the latch rises to a logic one. The logic one from the first latch clock-enables the second latch in the series so that the output of the second latch rises to a logic one, which in turn enables the next latch in the series. The time required for a rising edge to traverse the entire sequence of latches is the cumulative time required for the output of each latch to change in response to a clock-enable signal. Consequently, the delay through the series of latches provides a measure of the time required for one of the latches to respond to a clock-enable signal. In another embodiment, the latches are arranged in a loop so that the sequence of latches forms a ring oscillator, the period of which provides an indication of the time required for the latches to respond to clock-enable signals. Other embodiments include sequences of flip-flops arranged as delay elements or ring oscillators. Those embodiments provide means for measuring the time required for flip-flops to respond to preset or clear signals.

15 Claims, 10 Drawing Sheets

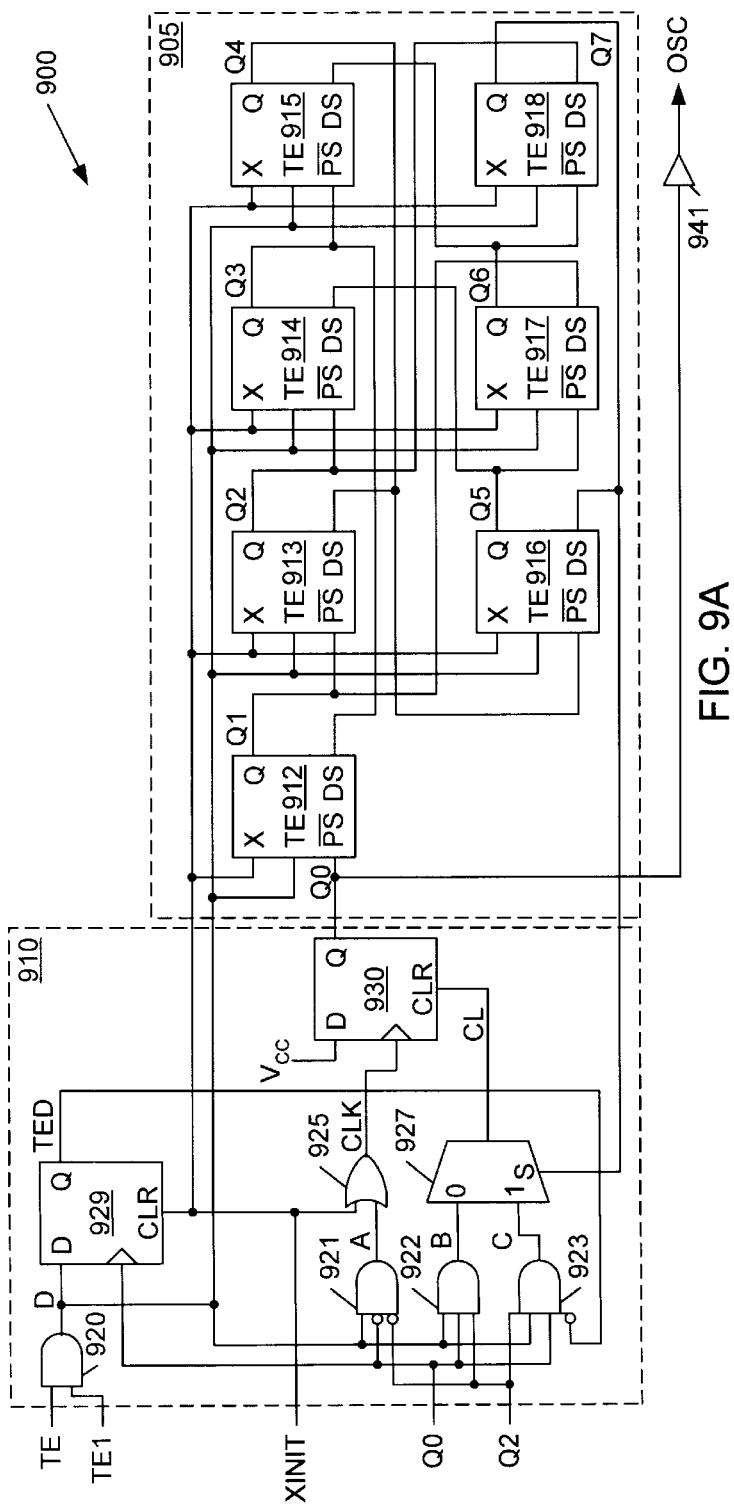
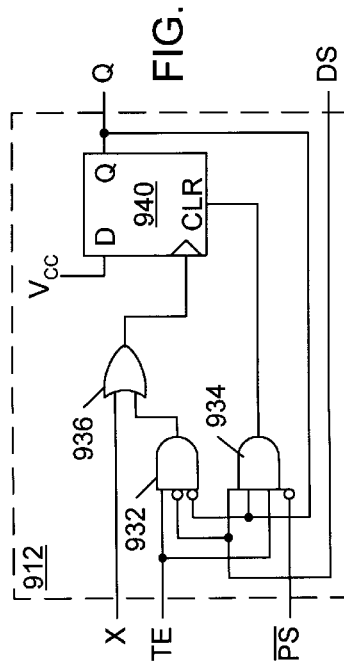
FIG. 9A
FIG. 9B

ND_262

CIRCUIT FOR MEASURING SIGNAL DELAYS OF ASYNCHRONOUS REGISTER INPUTS

CROSS REFERENCE TO RELATED APPLICATIONS

This application is a continuation-in-part of U.S. patent application Ser. No. 09/235,419, now Pat. No. 6,075,418, entitled "System With Downstream Set or Clear for Measuring Signal Propagation Delays on Integrated Circuits," by Christopher H. Kingsley, Robert W. Wells, and Robert D. Patrie, filed Jan. 20, 1999, which is a continuation-in-part of U.S. patent application Ser. No. 09/115,204; entitled "Built-In Self Test Method For Measuring Clock To Out Delays," by Robert W. Wells, Robert D. Patrie, and Robert O. Conn, filed Jul. 14, 1998, which is a continuation-in-part of Ser. No. 08/710,465 U.S. Pat. No. 5,790,479 filed Sep. 17, 1996 and issued Aug. 4, 1998. This appln claims the benefit of US Provisional No. 60/107,765 filed Nov. 9, 1998. This application is related to:

1. U.S. patent application Ser. No. 09/083,892, now U.S. Pat. No. 6,005,829, entitled "Method For Characterizing Interconnect Timing Characteristics," by Robert O. Conn, filed May 21, 1998;
2. U.S. patent application Ser. No. 09/115,138, now U.S. Pat. No. 6,069,849, entitled "Method and Circuit for Measuring Signal Propagation Delays Using the Duty Cycle of a Ring Oscillator," by Christopher H. Kingsley, Robert W. Wells, and Robert D. Patrie, filed Jul. 14, 1998;
3. U.S. patent application Ser. No. 09/114,369, entitled "Method and System for Measuring Signal Propagation Delays Using Ring Oscillators," by Robert W. Wells, Robert D. Patrie, et al., filed Jul. 14, 1998;
4. U.S. patent application Ser. No. 09/244,753, entitled "Built-In AC Self Test Using Pulse Generators," by Gilbert A. Speyer, David L. Ferguson, et al., filed Feb. 5, 1999; and
5. U.S. patent application Ser. No. 09/360,350, entitled "Circuit For Measuring Signal Delays in Synchronous Memory Elements," by Christopher H. Kingsley, Trevor J. Bauer, Robert W. Wells, and Robert D. Patrie, filed herewith.

Each of the foregoing documents is incorporated herein by reference.

FIELD OF THE INVENTION

This invention relates generally to methods and circuit configurations for measuring signal propagation delays, and in particular for measuring signal propagation delays through synchronous memory elements.

BACKGROUND

Integrated circuits (ICs) are the cornerstones of myriad computational systems, such as personal computers and communications networks. Purchasers of such systems have come to expect significant improvements in speed performance over time. The demand for speed encourages system designers to select ICs that guarantee superior speed performance. This leads IC manufactures to carefully test the speed performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 from input pin 130 to output pin 140. The resulting time period is the timing parameter for test circuit 110, the path of interest. Such parameters are typically published in literature associated with particular ICs and/or used to model the speed performance of circuit designs that employ the path of interest.

Conventional test procedures are problematic for at least two reasons. First, many signal paths within a given IC are not directly accessible via input and output pins, and therefore cannot be measured directly. Second, testers have tolerances that can have a significant impact on some measurements, particularly when the path of interest is short. For example, if a tester accurate to one nanosecond measures a propagation delay of one nanosecond, the actual propagation delay might be any time between zero and two nanoseconds. In such a case the IC manufacturer would have to assume the timing parameter was two nanoseconds, the worst-case scenario. If ICs are not assigned worst-case values, some designs will fail. Thus, IC manufacturers tend to add relatively large margins of error, or "guard bands," to ensure that their circuits will perform as advertised. Unfortunately, this means that those manufacturers will not be able to advertise their full speed performance, which could cost them customers in an industry where speed performance is paramount.

Programmable logic devices (PLDs) are a well-known type of digital integrated circuit that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). This collection of configurable logic is configured by loading configuration data into internal configuration memory cells that define how the CLBs, interconnections, and IOBs are configured.

Each programming point, CLB, interconnection line, and IOB introduces some delay into a signal path. The many potential combinations of delay-inducing elements make timing predictions particularly difficult. FPGA designers use "speed files" that include resistance and capacitance values for the various delay-inducing elements and combine them to establish delays for desired signal paths. These delays are then used to predict circuit timing for selected circuit designs implemented as FPGA configurations. FPGA timing parameters are assigned worst-case values to ensure FPGA designs work as indicated.

Manufacturers of ICs, including FPGAs, would like to achieve the highest speed performance possible without causing ICs to fail to meet the guaranteed timing specifications. More accurate measurements of circuit timing allow IC designers to use smaller guard bands to ensure correct device performance, and therefore to guarantee higher speed performance. There is therefore a need for a more accurate means of characterizing IC speed performance.

SUMMARY

The present invention provides an accurate means of measuring IC speed performance. The inventive circuit is particularly useful for testing programmable logic devices, which can be programmed to include a device for testing a majority of the requisite test circuitry.

The time required for the output of a latch to change states in response to a clock-enable signal is a parameter of interest in modeling IC speed performance. In accordance with one embodiment of the invention, a number of latches are configured in series. Each latch is initialized to store a logic zero. The first latch is then clock-enabled so that the output of the latch rises to a logic one. The logic one from the first latch clock-enables the second latch in the series so that the output of the second latch rises to a logic one, which in turn enables the next latch in the series. The rising edge thus propagates through all of the latches in the series until every latch is enabled.

Because the latches are enabled in sequence, the time required for a rising edge to traverse the entire series of latches is the sum of the enable delays of the individual latches. Consequently, the delay through the series of latches provides a measure of the time required for one of the latches to respond to a clock-enable signal.

In one embodiment, the latches are arranged in a loop so that the series of latches forms a ring oscillator. In that embodiment, an initial clock-enable signal traverses the series of latches and is then fed back to the first latch to traverse the series again. Each latch is returned to the initialized state before the return of the clock-enable signal so that the individual latches are prepared to change state upon the receipt of each subsequent clock-enable signal.

The time required for the output of a memory element to change states in response to a clear signal is another parameter of interest in modeling IC speed performance. One embodiment of the invention provides a means of measuring such clear delays. In accordance with that embodiment, a number of flip-flops are configured in series. Each flip-flop is initialized to store a logic one. An initial clear signal clears a first one of the flip-flops so that the output of the first flip-flop falls to logic zero. The falling logic level from the first flip-flop then clears the second flip-flop in the series so that the output of the flip-flop falls to logic zero, which in turn clears the next flip-flop in the series. The falling edge thus propagates through all of the flip-flops.

The time required for a falling edge to traverse the entire sequence of flip-flops is the total time required to successively clear each flip-flop. Consequently, the delay through the series provides a measure of the time required to clear the flip-flops.

In one embodiment, the flip-flops are arranged in a loop so that the sequence of memory elements forms a ring oscillator. The oscillation period provides a measure of the delay through the sequence of memory elements, and therefore a measure of the average time required to clear the series of flip-flops. Each time a flip-flop is cleared, feedback signals from one or more downstream flip-flops re-initialize the cleared flip-flop in preparation for a subsequent clear signal.

The time required for the output of a memory element to change states in response to a preset signal is yet another parameter of interest. Another embodiment of the invention provides a measure of preset delays using a series of flip-flops initialized to store logic zeros. An initial preset signal presets a first one of the flip-flops so that the output of the first flip-flop rises to logic one. The rising logic level from the first flip-flop then presets the second flip-flop in the series so that the output of the second flip-flop rises to logic one, which in turn presets the next flip-flop in the series. The rising edge thus propagates through all of the flip-flops.

The time required for a rising edge to traverse the entire sequence of flip-flops is the total time required to successively preset each flip-flop. Consequently, the delay through the series provides a measure of the time required to preset the flip-flops. As with the embodiments configured to measure clear delays, the flip-flops can be arranged in a loop so that the sequence of flip-flops forms a ring oscillator. Each time a flip-flop is preset, feedback signals from one or more downstream flip-flops re-initialize the flip-flop in preparation for a subsequent preset signal.

BRIEF DESCRIPTION OF THE FIGS.

Figure 6:
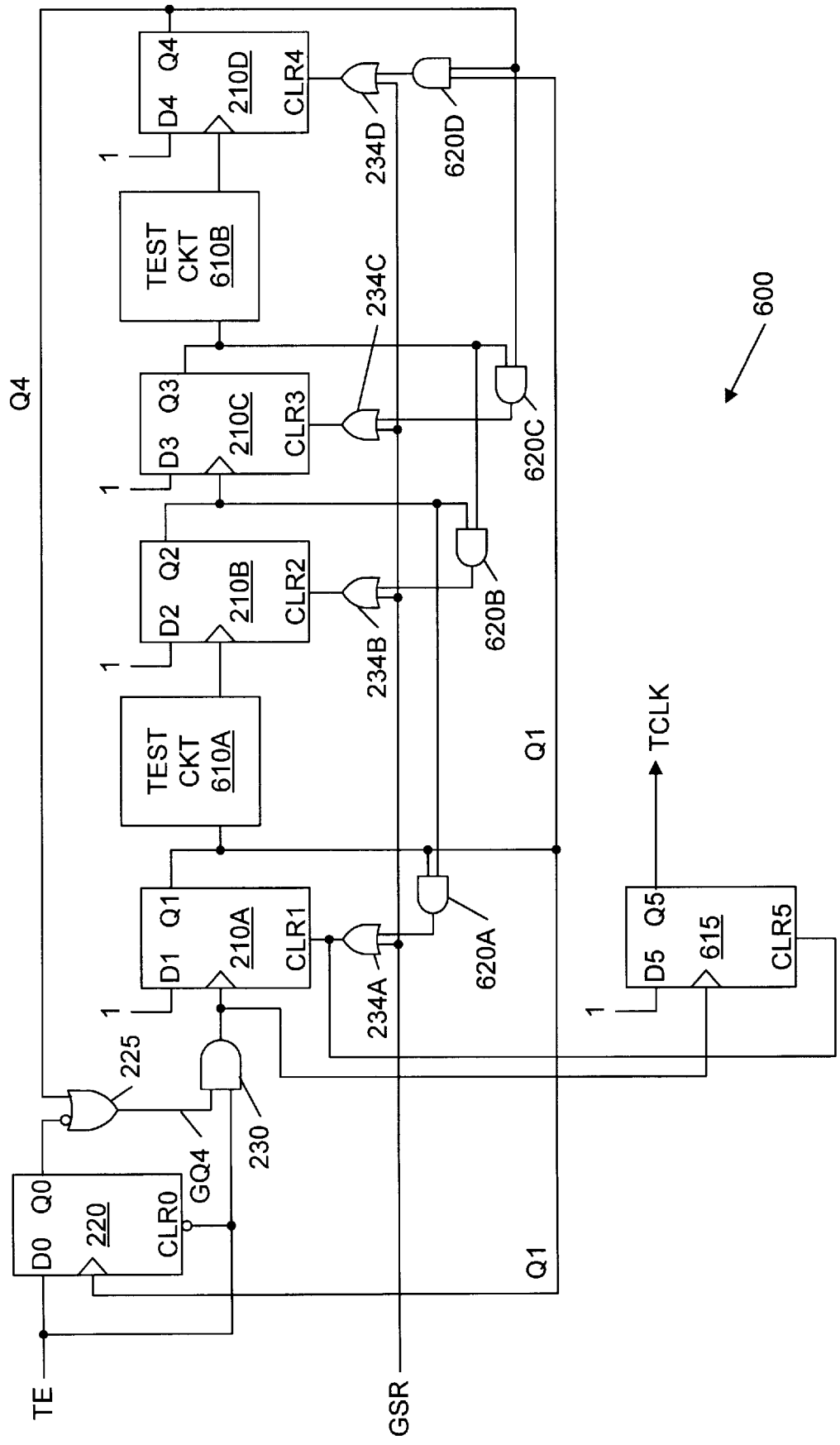
Figure 7:
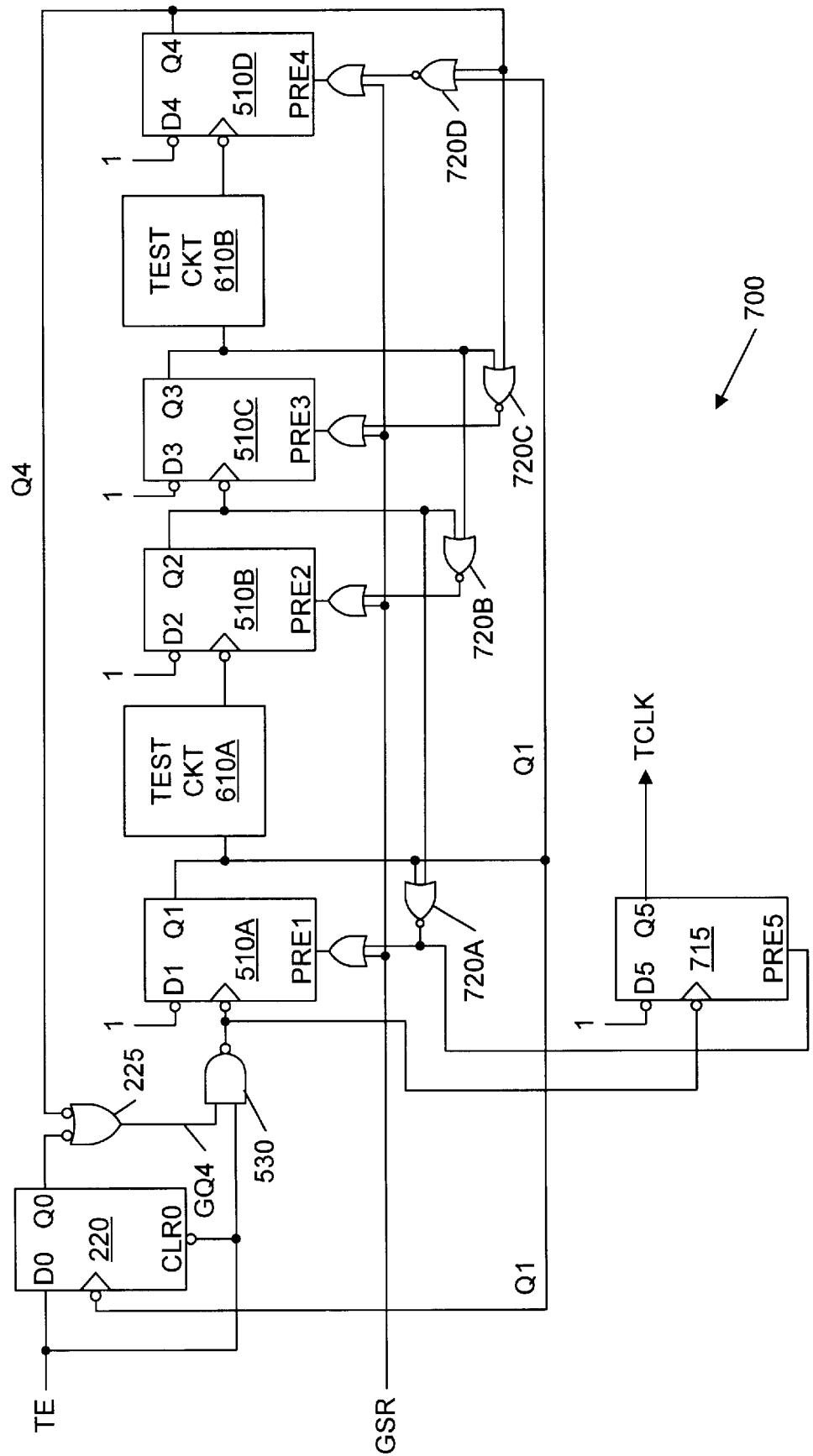

FIG. 6 is a schematic diagram of an oscillator 600 configured to produce a test-clock signal TCLK for which the period $T_{TCLK}$ includes the combined delays of flip-flops 210A–D and test circuits 610A and 610B; and FIG. 7 is a schematic diagram of an oscillator 700 configured to produce a test-clock signal TCLK for which the period $T_{TCLK}$ includes the combined delays of flip-flops 510A–D and test circuits 610A and 610B.

Figure 8A:
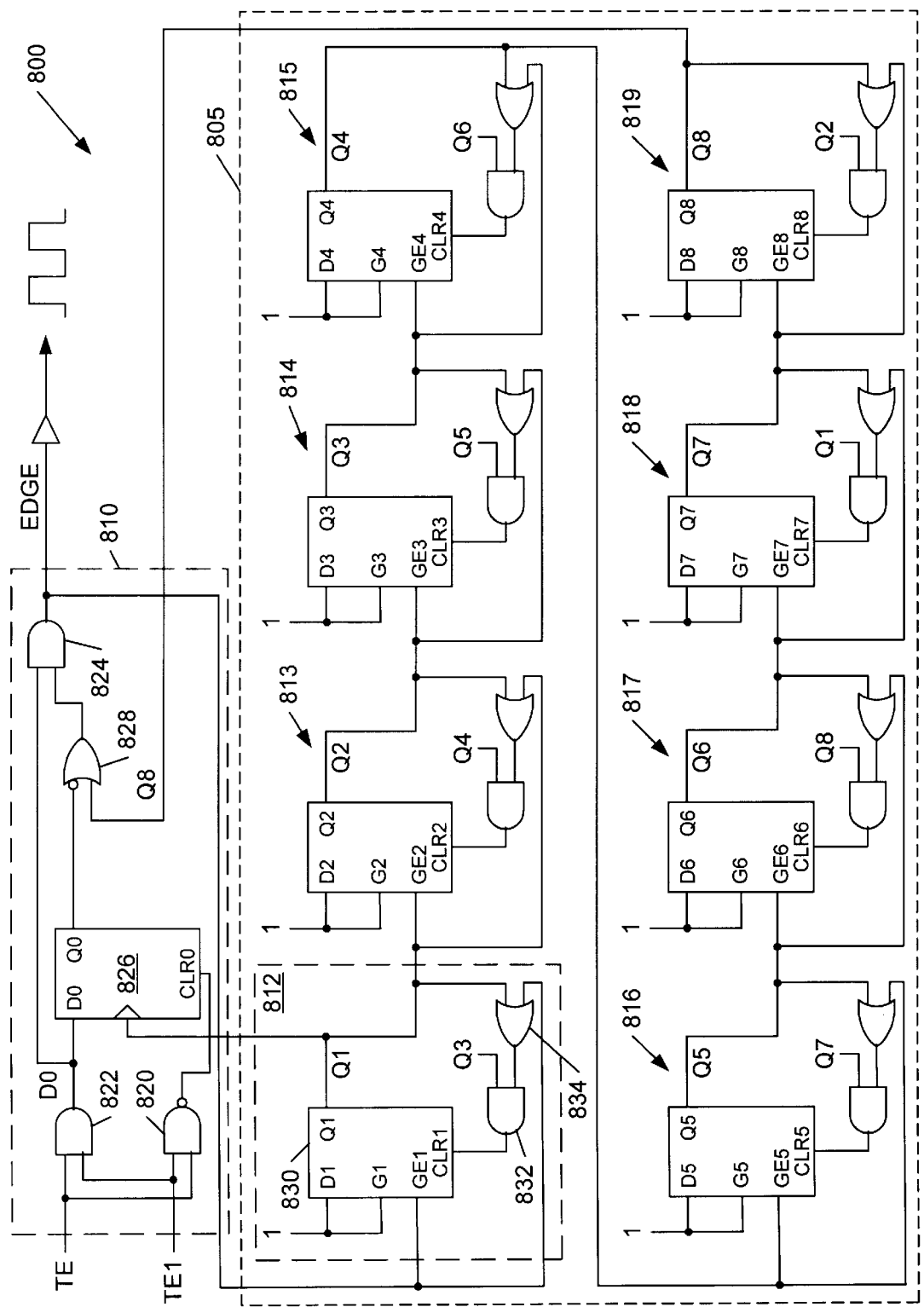

FIG. 8A depicts an oscillator circuit 800 that can be used in accordance with the invention to measure enable-to-Q delays of latches.

Figure 8B:
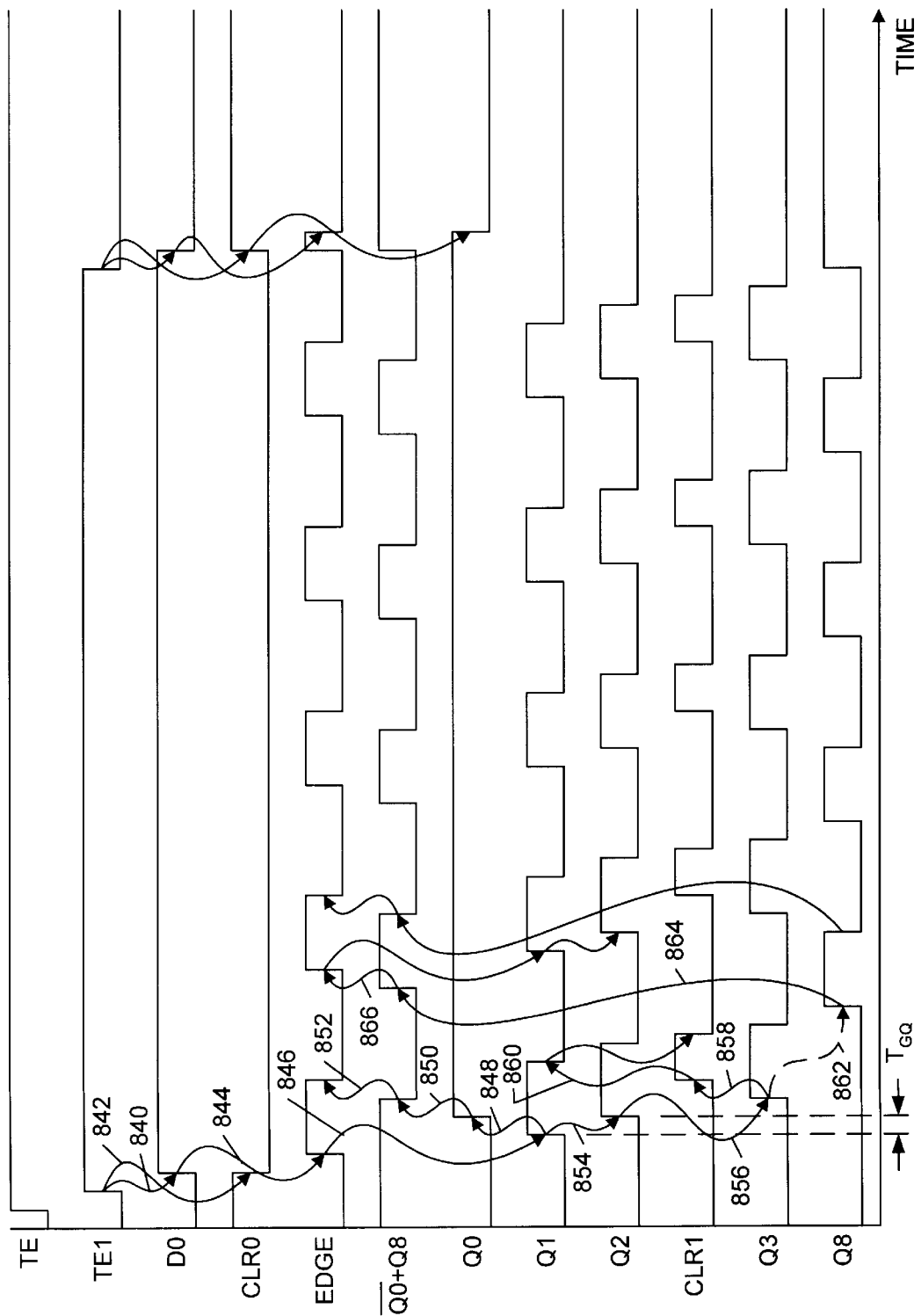

FIG. 8B is a waveform diagram depicting the operation of oscillator 800 of FIG. 8A.

FIG. 9A depicts an oscillator 900 that can be used in accordance with the invention to measure the time required for a clear signal to affect a change on the output terminal of a flip-flop.

FIG. 9B is a detailed diagram of flip-flop 912 of FIG. 9A.

Figure 9C:
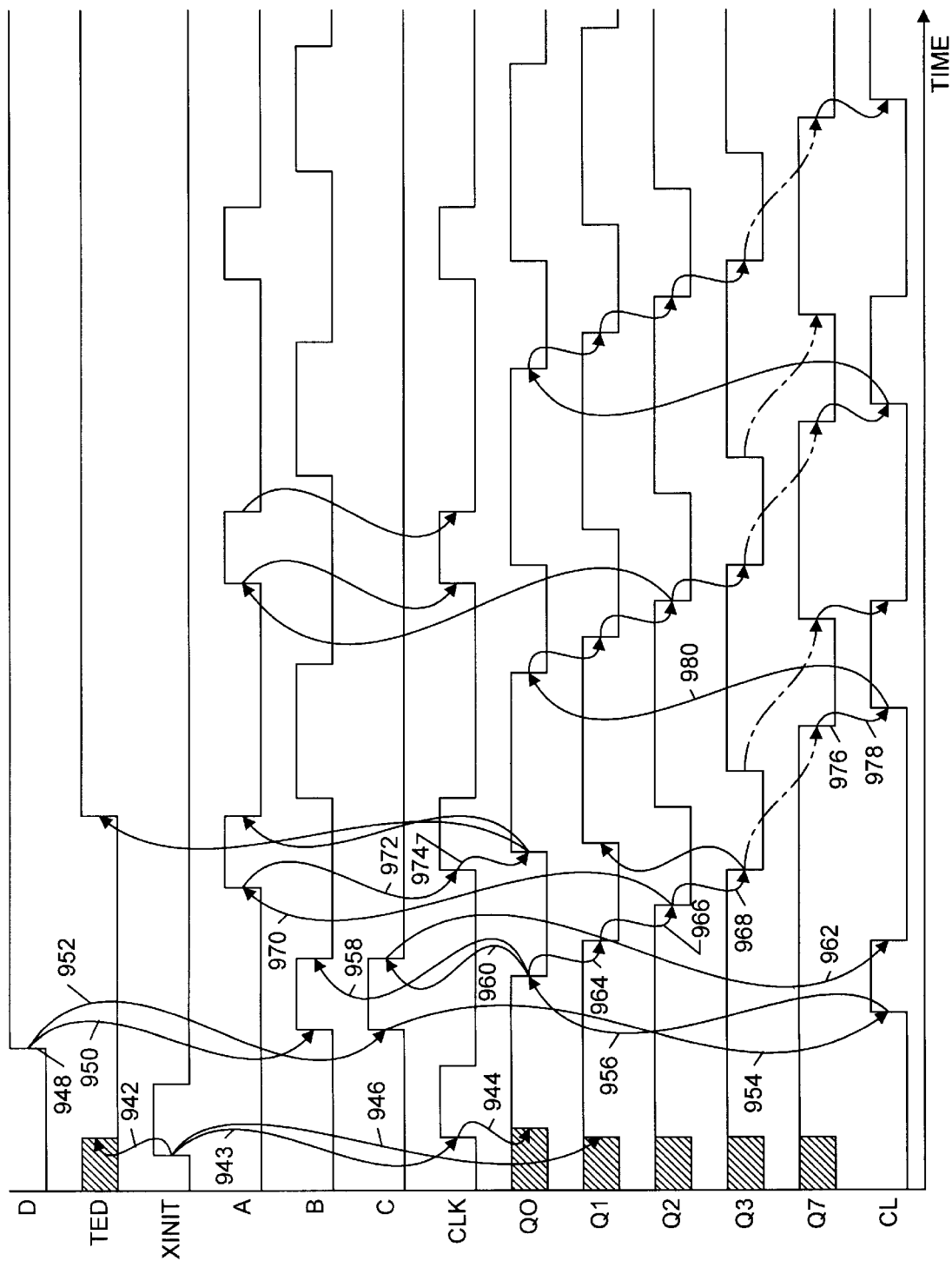

FIG. 9C is a waveform diagram depicting the operation of oscillator 900 of FIG. 9A.

Figure 10A:
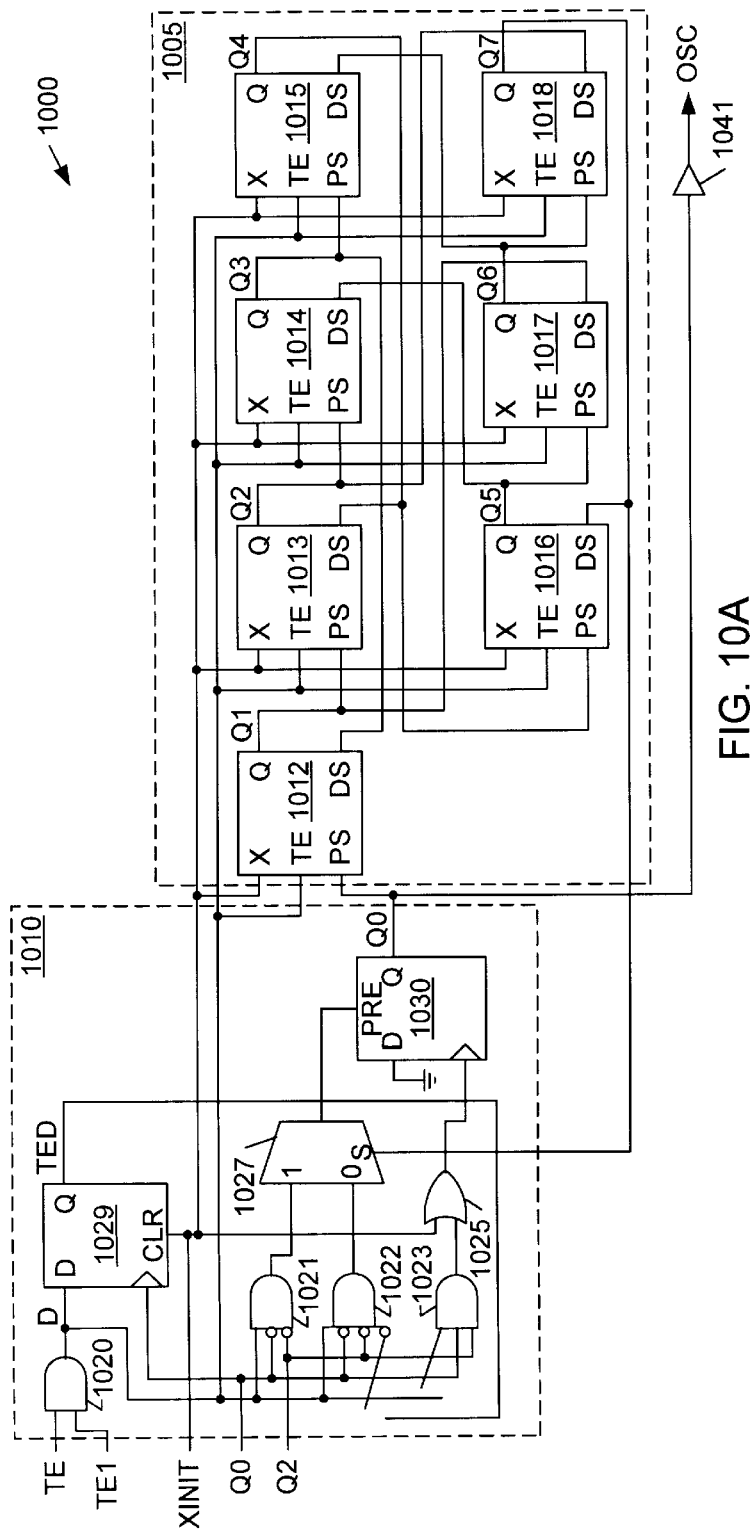

FIG. 10A depicts an oscillator 1000 that can be used in accordance with the invention to measure the time required for a preset signal to affect a change on the output terminal of a flip-flop.

Figure 10B:
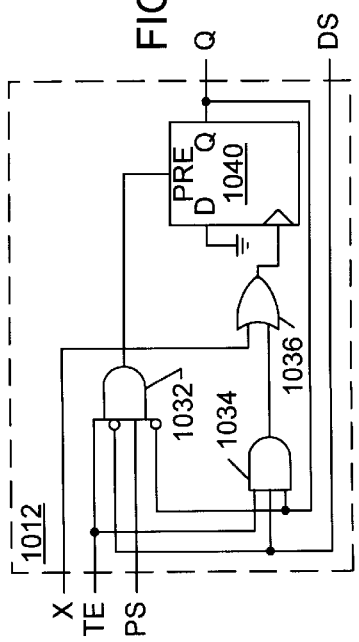

FIG. 10B is a detailed diagram of flip-flop 1012 of FIG. 10A.

DETAILED DESCRIPTION

Figure 2:
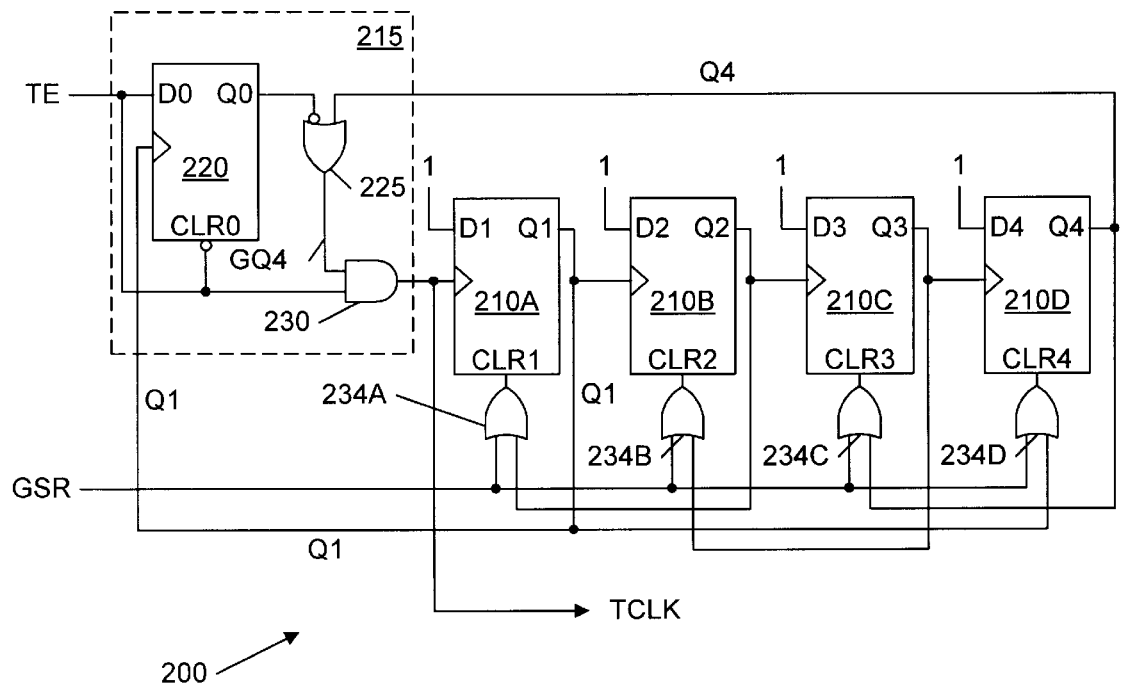
FIG. 2 is a schematic diagram of an oscillator 200 configured to produce a test-clock signal TCLK for which the period $T_{TCLK}$ includes the clock-to-out delays of flip-flops 210A–D.

FIG. 2 is a schematic diagram of an oscillator 200. In accordance with the invention, the depicted configuration produces an oscillating test signal having a period including the clock-to-out delays of four synchronous components, flip-flops 210A–210D. Other embodiments include additional signal paths for which the associated signal propagation delays are of interest. Examples of such embodiments are described below in connection with FIGS. 6 and 7.

Oscillator 200 includes an oscillator-enable circuit 215 connected to the clock input of flip-flop 210A via a test-clock line TCLK. Oscillator-enable circuit 215 in turn includes a flip-flop 220, an OR gate 225, an AND gate 230, and an inverter 232. As discussed below in connection with FIG. 3, oscillator-enable circuit 215 produces an edge on test-clock line TCLK when test-enable line TE is brought high. The rising edge causes oscillator 200 to begin oscillating. Returning test-enable line TE to a logic zero turns oscillator 200 off.

A test-enable line TE connects to a synchronous input terminal D0 of flip-flop 220, an asynchronous input terminal CLR0 of flip-flop 220, and an input terminal of AND gate 230. Test-enable line TE, inverted by inverter 232, also connects to the clear inputs CLR1–CLR4 of flip-flops 210A–210D via respective OR gates 234A–234D. A synchronous output terminal Q0 of flip-flop 220 connects to an input of OR gate 225. The output terminal of OR gate 225 connects to the remaining input terminal of AND gate 230 via a line GQ4. Oscillator-enable circuit 215 also includes a pair of input lines Q3 and Q4 from respective flip-flops 210C and 210D: line Q3 connects to the clock input of flip-flop 220; line Q4 connects to the second input terminal of OR gate 225.

The synchronous "Q" output terminal of each flip-flop 210A–D is connected to:

1) the clock terminal (conventionally designated using a ">" symbol) of a subsequent flip-flop, and 2) an asynchronous clear terminal of a previous flip-flop via a respective OR gate.

For example, output terminal Q3 of flip-flop 210C connects to both the clock terminal of flip-flop 210D and, through OR gate 234B, the asynchronous clear terminal CLR2 of flip-flop 210B. Each rising edge on any given clock terminal thus propagates through to the subsequent flip-flop; the subsequent flip-flop then clears the preceding flip-flop to prepare the preceding flip-flop for the next rising edge. Each subsequent flip-flop thus acts as a synchronous delay element between the output terminal and the clear terminal of the previous flip-flop. Output terminal Q4 from flip-flop 210D is connected, through circuit 215, to the clock input terminal of flip-flop 210A so that flip-flops 210A–D form a ring oscillator.

Figure 3:
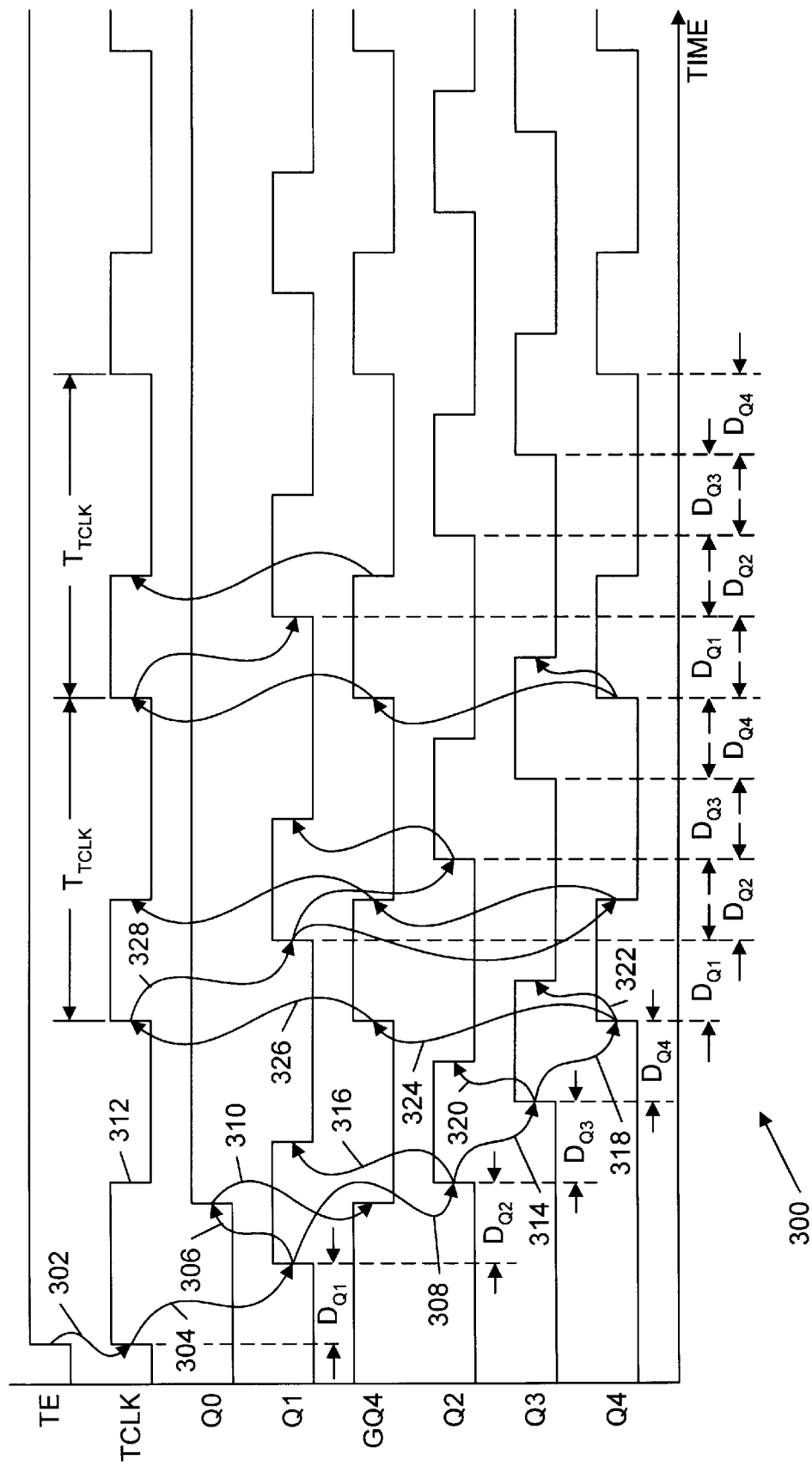
FIG. 3 is a waveform diagram depicting the operation of oscillator 200 of FIG. 2.

FIG. 3 is a waveform diagram depicting the operation of oscillator 200 of FIG. 2. Each waveform in FIG. 3 is labeled using the corresponding node designation depicted in FIG. 2. Lines terminating with differently named input and output nodes are named for output nodes. For example, the line connecting output terminal Q2 of flip-flop 210B to the clock terminal of flip-flop 210C and the clear terminal of flip-flop 210A is labeled "Q2." The node designations are hereafter used to alternatively refer to circuit nodes or their corresponding signals. In each instance, the interpretation of the node designations as either signals or physical elements will be clear from the context.

When test-enable line TE is not asserted (i.e., is at a logic zero), all of flip-flops 220 and 210A–210D are cleared by the logic one provided on the output terminal of inverter 232. Thus, the respective "Q" output terminals of flip-flops are at logic zero. OR gate 225, having a logic zero on its inverting input from output terminal Q0, outputs a logic one on line GQ4.

A test cycle begins when test-enable line TE is asserted (brought to a logic one). Because line GQ4 is also a logic one, AND gate 230 passes the rising edge from test-enable signal TE to test-clock terminal TCLK (arrow 302), and consequently to the clock terminal of flip-flop 210A. The rising edge on the clock terminal of flip-flip 210A clocks flip-flop 210A so that the logic one on input terminal D1 transfers to output terminal Q1 after the clock-to-out delay $D_{Q1}$ associated with flip-flop 210A (arrow 304).

The rising edge of signal Q1 does two things. First, the rising edge of signal Q1 clocks flip-flop 210B so that the logic one on input D2 transfers to output terminal Q2 after the clock-to-out delay $D_{Q2}$ associated with flip-flop 210B (arrow 308). Second, the rising edge of signal Q1 clears flip-flop 210D. Clearing flip-flop 210D has no impact in the first instance of a rising edge on terminal Q1. However, as described below, each subsequent rising edge on test-clock line TCLK occurs when output Q4 of flip-flop 210D goes high; thus flip-flop 210D must be reset (cleared) to prepare TCLK for subsequent rising edges.

The rising edge on line Q0 produces a falling edge on line GQ4 (arrow 310), which in turn produces a falling edge 312 on line TCLK. Flip-flop 210A, a positive-edge-triggered flip-flop, is unaffected by falling edge 312. Falling edge 312 is important, however, because it prepares flip-flop 210A to respond to a subsequent rising clock edge.

The rising edge of signal Q2 clocks flip-flop 210C so that the logic one on input D3 transfers to output Q3 after the clock-to-out delay $D_{Q3}$ associated with flip-flop 210C (arrow 314). The rising edge of signal Q2 also clears flip-flop 210A, returning output terminal Q1 to a logic zero (arrow 316). The resulting rising edge of signal Q3 then clocks flip-flop 210D so that the logic one on input D4 transfers to output Q4 after the clock-to-out delay $D_{Q4}$ associated with flip-flop 210D (arrow 318). The rising edge of signal Q3 also clears flip-flop 210B (arrow 320) and clocks flip-flop 220 so that line Q0 rises to a logic one (arrow 306). Line Q0 then remains at logic one for the duration of the test period, or as long as test-enable signal TE is asserted. Finally, the rising edge on line Q4 clears flip-flop 210C (arrow 322) and propagates through OR gate 225 and AND gate 230 to clock flip-flop 210A once again (arrows 324 and 326). Oscillator 200 then continues to cycle a pulse through flip-flops 210A–D until test-enable line TE returns to a logic zero, which causes AND gate 230 to block the feedback from flip-flop 210D from clocking flip-flop 210A.

Cycling a pulse through flip-flops 210A–210D produces an oscillating test signal on test-clock terminal TCLK. The period $T_{TCLK}$ of the test signal includes the sum of clock-to-out delays $D_{Q1}$, $D_{Q2}$, $D_{Q3}$, and $D_{Q4}$.

Figure 4:
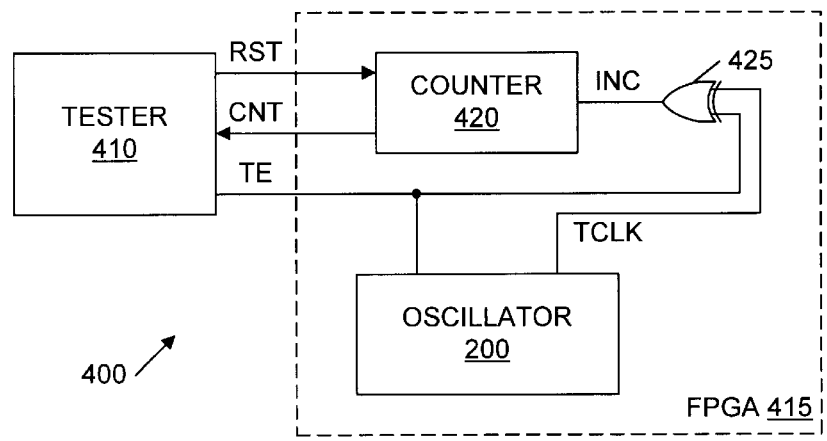
FIG. 4 is a schematic diagram of a system 400 for measuring test-clock period $T_{TCLK}$ of oscillator 200 of FIG. 2.

FIG. 4 is a schematic diagram of a system 400 for measuring test-clock period $T_{TCLK}$ of oscillator 200 of FIG. 2. System 400 includes a conventional tester 410 connected to an FPGA 415. In accordance with the invention, FPGA 415 is configured to include a counter 420, an AND gate 425, and oscillator 200. System 400 may also be used with other types of oscillators, such as those described below in connection with FIGS. 5 and 6.

Test-clock line TCLK connects to counter 420 via AND gate 425. Counter 420 is a conventional binary counter adapted to count the number of rising edges on increment line INC from AND gate 425. Counter 420 connects to tester 410 via a test-count line CNT and a reset line RST. Reset line RST allows tester 410 to reset counter 420 to zero.

Tester 410 defines a test period by asserting test-enable signal TE. Oscillator 200 outputs an oscillating test-clock signal TCLK for as long as test-enable signal TE is asserted, and counter 420 increments for each rising edge of the test-clock signal TCLK. Thus, after test-enable line TE is asserted for the test period, counter 420 will contain the number of oscillations that oscillator 200 generated over the test period. This number is fed to tester 410 on line CNT. Calculating the period $T_{TCLK}$ of oscillator 200 is then a simple matter of dividing the test period by the number of counts stored in counter 420. For example, if test-enable line TE was held high for one second to achieve a count of 1,000, then the oscillation period $T_{TCLK}$ of oscillator 237 is one second divided by 1,000, or 1 millisecond.

System 400 provides a very accurate measure of the delay through oscillator 200 by counting over many cycles. Moreover, the method is relatively inexpensive to implement using FPGAs because FPGAs can be configured to simultaneously include many test circuits and the test circuitry (e.g., oscillator 200 and counter 420) required to test them. Elements 210A–D can also be employed as a delay element for measuring signal propagation delays. For example, elements 210A–D can be used in test configuration 100 in place of test circuit 110.

In practice, synchronous components can exhibit different propagation delays depending upon whether they are configured to respond to rising clock edges or falling clock edges. There is therefore a need for a way to determine the clock-to-out delays for synchronous components adapted to respond to falling clock edges.

Figure 5:
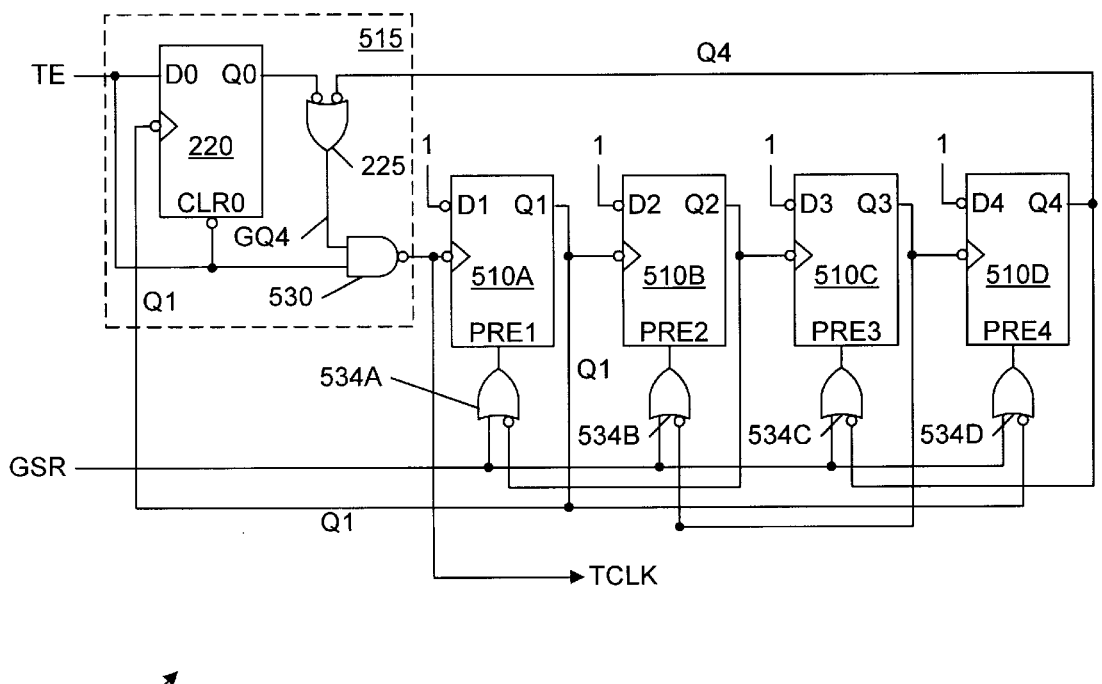
FIG. 5 is a schematic diagram of an oscillator 500 configured to produce a test-clock signal TCLK for which the period $T_{TCLK}$ includes the clock-to-out delays of flip-flops 510A–D.

FIG. 5 is a schematic diagram of an oscillator 500 configured to produce a test-clock signal TCLK for which the period $T_{TCLK}$ includes the clock-to-out delays of flip-flops 510A–510D. Flip-flops 510A–510D are falling-edge triggered, as indicated by the "bubbles" on their respective clock terminals. The operation of oscillator 500 is similar to that of oscillator 200 of FIG. 2, except that the test-clock period $T_{TCLK}$ of oscillator 500 includes the delay associated with falling edges propagating through flip-flops 510A–510D, whereas the test-clock period $T_{TCLK}$ of oscillator 200 includes the delay associated with rising edges propagating through flip-flops 210A–210D. Due to the similarities of oscillators 200 and 500, a detailed description of the operation of oscillator 500 is omitted for brevity.

Flip-flops 510A–510D are similar to flip-flops 210A–210D. However, the respective "D" inputs are connected to logic zero, the clock terminals are negative-edge triggered, and instead of having feedback connections to clear inputs as in flip-flops 210A–210D, each of flip-flops 510A–510D has a feedback line connected through inverting inputs of one of OR gates 534A–534D to a respective preset terminal (e.g., output terminal Q2 of flip-flop 510B connects through OR gate 534A to preset terminal PRE1 of flip-flop 510A). Oscillator 500 also includes an oscillator-enable circuit 515 that is similar to oscillator-enable circuit 215, but differs in that the polarities of the D0 and clock input terminals of flip-flop 220 and the Q4 input terminal of NOR gate 225 are reversed, and AND gate 230 is replaced by a NAND gate 530.

Oscillator 200 of FIG. 2 and oscillator 500 of FIG. 5 can be used to determine, separately, the delays associated with falling and rising edges propagating through flip-flops of the type used to implement flip-flops 210A–D and 510A–D. The worst-case delay for such flip-flops can then be expressed as the longer of the two. Knowing the precise worst-case delay allows IC designers to minimize the guard band and consequently guarantee higher speed performance. In addition, knowing which type of signal transition propagates more slowly allows IC designers to optimize signal paths more efficiently by focusing on those components responsible for the slower performance.

Clock-to-out delays are not the only propagation delay of interest. Various types of asynchronous signal paths are also characterized to produce speed files that may be employed to accurately predict IC speed performance. Some embodiments of the invention are therefore adapted to measure the delays associated with asynchronous test circuits.

FIG. 6 is a schematic diagram of an oscillator 600 configured, in accordance with the invention, to include a pair of similar asynchronous test circuits 610A and 610B. Test circuits 610A and 610B might be any signal paths for which the associated signal propagation delays are of interest. In one embodiment, for example, test circuits 610A and 610B are signal paths on an FPGA.

Oscillator 600 is similar to oscillator 200, like-numbered elements being the same. Oscillator 600 additionally includes a flip-flop 615, and four AND gates 620A–D. Flip-flop 615, identical to flip-flop 210A, minimizes the loading effect of test-clock line TCLK so that the clock-to-out timing of flip-flops 210A–D is accurately represented by the oscillation period of oscillator 600.

Alternative embodiments that also achieve the goal of reducing loading on AND gate 230 include making flip-flop 615 a toggle flip-flop. (A toggle flip-flop includes an inverter feeding back that flip-flop's Q output to the D input so that the toggle flip-flop changes state each clock period.) A toggle flip-flop would guarantee a 50% duty cycle on test-clock terminal TCLK. Placing a buffer between the output of AND gate 230 and test-clock terminal TCLK also reduces loading on AND gate 230.

As with oscillator 200, the test-clock period $T_{TCLK}$ of test-clock signal TCLK includes the rising-edge delay through flip-flops 210A–210D. However, the addition of test circuits 610A and 610B increases the signal propagation delay through flip-flops 210A–D so that the total test-clock period $T_{TCLK}$ increases by an amount equal to the combined rising-edge delay $D_R$ of test circuits 610A and 610B.

If a rising edge propagates too quickly through flip-flops 210A–210D, it is possible that the rising edge can arrive to clock one of flip-flops 210A–210D while the clear signal on its clear terminal is still asserted. Such a case could stop oscillator 600 from oscillating. AND gates 620A–620D reduce the likelihood of such a stoppage by reducing the pulse width of the clear signal. Without AND gate 620C, for example, the clear signal CLR3 rises and falls with signal Q4. With AND gate 620C, the clear signal CLR3 still rises with signal Q4, but falls with signal Q3.

The oscillator of FIG. 6 will function correctly without the additional gates 620A–620D provided that the delays in propagating the clear signal to terminals CLR1–CLR4 are small compared to delays through the clock path in flip-flops 210A–210D and through synchronous elements 610A and 610B. For example, for flip flop 210C to function correctly, the clear delay from a rising edge at terminal Q1 of flip-flop 210A to terminal CLR4 of flip flop 210D to the resulting falling edge of terminal Q4 to the clear terminal CLR3 of flip-flop 210C must be shorter than the clock path delay from the rising edge at terminal Q1 to asynchronous element 610A to the clock terminal of flip-flop 210B to the rising edge of the Q2 terminal of flip-flop 210B to the rising edge at the clock terminal of flip flop 210C. This condition will be satisfied if the propagation path of the clear signal is fast, or if the delay in element 610A is large enough. However, if this condition cannot be satisfied, AND gates 620A–620D create a condition more easily satisfied.

With AND gates 620A–620D in the circuit, as shown in FIG. 6, there is still a constraint on the propagation delays of the clear and clock signals. There would he an incorrect pulse at the clear terminal of flip-flop 210C if the Q4 input to AND gate 620C were still high when the Q3 output of flip-flop 210C goes high. To prevent such a condition, the delay from the rising edge at terminal Q1 of flip-flop 210A to the rising edge of clear terminal CLR4 of flip-flop 210D to the falling edge of output terminal Q4 of flip-flop 210D to the Q4 input terminal of AND gate 620C must be less than:

the delay from the rising edge at terminal Q1 of flip-flop 210A through asynchronous component 610A to the clock terminal of flip-flop 210B to the rising edge at the Q2 output terminal of flip-flop 210B to the rising edge of the clock terminal of flip-flop 210C to the rising edge of the Q3 output terminal of flip-flop 210C to the rising edge of the Q3 input signal to AND gate 620C.

This condition is clearly more easily satisfied than the condition required when AND gate 620C is not present. Test circuits 610A and 610B might be a pair of identical signal paths or a bisected signal path. Providing a pair of test circuits in the depicted configuration produces a more balanced test-clock waveform, helping to ensure that one edge of test-clock signal TCLK does not overtake another. FIG. 7 is a schematic diagram of an oscillator 700 similar to oscillator 500 of FIG. 5, like-numbered elements being the same. Oscillator 700 also includes the same test circuits 610A and 610B as FIG. 6. Oscillator 700 is configured so that test-clock period $T_{TCLK}$ includes the falling-edge delay $D_F$ through flip-flops 210A–D and test circuits 610A and 610B. The differences between oscillator 700 and oscillator 600 are the same as the differences between oscillator 400 and oscillator 200. A complete description of the operation of oscillator 700 is therefore omitted for brevity.

The time required for the output of a latch to change states in response to a clock-enable signal is a parameter of interest in modeling IC speed performance. Hereafter, this delay is referred to as the "enable-to-Q delay." (Labeling the clock terminal "G" is conventional when referring to a latch.) FIG. 8A depicts an oscillator circuit 800 that can be used in accordance with the invention to measure enable-to-Q delays of latches.

Oscillator 800 includes a delay circuit 805 and an oscillator-enable circuit 810. Delay circuit 805 includes eight latch stages 812–819. Oscillator-enable circuit 810 includes a NAND gate 820, a pair of AND gates 822 and 824, a D flip-flop 826, and an OR gate 828. Latch stage 812 includes a level-triggered D latch 830, an AND gate 832, and an OR gate 834. The remaining latch stages 813–819 are identical to latch stage 812.

Oscillator-enable circuit 810 produces an edge in response to a pair of test-enable signals TE and TE1. The edge then traverses latch stages 812–819. Once through the last latch stage 819, the edge is fed back to the first stage 812. Latch stages 812–819 thus form a ring oscillator. As shown below, the period of the oscillator depends upon the clock-to-Q delay of each latch stage 812–819, and can therefore be used to measure the timing behavior of those elements.

FIG. 8B is a waveform diagram depicting the operation of oscillator 800 of FIG. 8A. Oscillator 800 has two test-enable lines. The first, TE, is a global test-enable line; the second, TE1, is a local test-enable line particular to oscillator 800. This configuration can be used, for example, when a number of oscillators are instantiated on different areas of an FPGA and a test engineer wants to test them independently.

Raising both test-enable lines high causes node D0 from AND gate 822 to rise (arrow 840) and the clear node CLR0 of flip-flop 826 to fall (arrow 842). AND gate 824 then passes the rising edge on node D0 via a line EDGE to latch stage 812 (arrow 844).

The rising edge on line EDGE clocks latch 830. The output Q1 of latch 830 rises in response to the clock (arrow 846) because input D1 is tied to a logic one (e.g., VCC). The rising edge clocks flip-flop 826, causing output terminal Q0 to rise (arrow 848). This, in turn, causes the signal on line EDGE to return to a logic zero (arrows 850 and 852). The rising edge on output terminal Q1 also clocks downstream latch stage 813 so that output terminal Q2 rises (arrow 854) after the clock-to-Q delay TGQ of latch stage 813.

Each latch stage 812–819 is similarly configured, so latch stages 813 and 814 each propagate the rising edge as did latch stage 812 (arrows 854 and 856). When the rising edge propagates through to output terminal Q3, AND gate 832 of latch stage 812 passes the rising edge to clear terminal CLR1 (arrow 858), clearing latch 830 (arrow 860). Clearing latch 830 prepares latch 830 to respond to a subsequent rising edge. The remaining latches in latch stages 813–819 are similarly cleared by downstream latch stages.

Each latch stage propagates the rising edge until the final output terminal Q8 rises (arrow 862). The rising edge on terminal Q8 then inspires another rising edge on line EDGE (arrows 864 and 866) and the cycle begins again.

Latch stages 812–819 continue to cycle the rising edge as long as both test enable terminals TE and TE1 remain high. As a result, the signal on line EDGE oscillates. The period of this oscillation, largely determined by the enable-to-Q delays of latch stages 813–819, can then be measured to find the enable-to-Q delays for the latches and associated circuitry. Measuring the period of an oscillating signal can be accomplished in many ways, as is well understood by those of skill in the art.

FIG. 9A depicts an oscillator 900 that can be used in accordance with the invention to measure the time required for a clear signal to affect a change on the output terminal of a flip-flop. Hereafter, this delay is referred to as the "clear-to-Q delay."

Oscillator 900 includes a delay circuit 905 and an oscillator-enable circuit 910. Delay circuit 905 includes seven flip-flop stages 912–918. Oscillator-enable circuit 910 includes four AND gates 920–923, an OR gate 925, a multiplexer 927, and a pair of D flip-flops 929 and 930. Flip-flop 912, as depicted in FIG. 9B, includes a pair of AND gates 932 and 934, an OR gate 936, and a flip-flop 940. The remaining flip-flop stages 913–918 are identical to flip-flop stage 912.

Oscillator 900 has two test-enable lines TE and TE1 similar to like-named terminals of FIG. 8A. Both test-enable lines TE and TE1 are brought high to initiate oscillation. Oscillator 900 additionally includes an initialization line XINIT that, when asserted, initializes each memory element in oscillator 900 to a known state.

Oscillator-enable circuit 910 produces a falling edge on terminal Q0 in response to a pair of test-enable signals TE and TE1. The edge then traverses flip-flop stages 912–918. Once through the last flip-flop 918, the edge is fed back to the first stage 912 through oscillator-enable circuit 910 to induce another cycle. Oscillator-enable circuit 910 and flip-flop stages 912–918 thus form oscillator 900. As shown below, the period of oscillator 900 depends upon the clear-to-Q delay of flip-flop 930 and each flip-flop stage 912–918. Consequently, the period of oscillator 900 can be used to measure the clear-to-Q delay of those elements.

FIG. 9C is a waveform diagram depicting the operation of oscillator 900 of FIG. 9A. Asserting signal XINIT clears flip-flop 929 (arrow 942), sets flip-flop 930 by clocking flip-flop 930 via OR gate 925 and clock line CLK (arrows 943 and 944), and sets each flip-flop in flip-flop stages 912–918 (arrow 946, for example) via their respective terminals labeled "X." Once all of the memory elements are initialized, both test-enable lines TE and TE1 are asserted, causing node D from AND gate 920 to rise (edge 948). AND gates 922 and 923 then pass this rising edge to respective B and C inputs of multiplexer 927 (arrows 950 and 952).

The select terminal S of multiplexer 927 connects to output terminal Q7 of flip-flop stage 918. Output terminal Q7, being initialized to logic one, causes multiplexer 927 to select line C so that the rising edge on line C asserts the clear signal on line CL to flip-flop 930 (arrow 954). Asserting the clear signal CL clears flip-flop 930, causing output signal Q0 to fall (arrow 956).

The falling edge on terminal Q0 causes the signals on terminals B and C to return low (arrows 958 and 960). The falling edge on terminal C then causes the clear signal on line CL to fall (arrow 962), preparing flip-flop 930 to receive a subsequent clear signal. The falling edge on terminal Q0 also clears the subsequent stage 912 (arrow 964) via terminal /PS of stage 912. (Terminal /PS is so-named because it is an active low signal connected to the "Previous Stage.")

Each flip-flop stage 912–918 is similarly configured, so that stages 913 and 814 each propagate the falling edge as did stage 912 (arrows 966 and 968). When the falling edge propagates through to output Q2, line A rises (arrow 970), producing a rising edge on the clock terminal CLK of flip-flop 930 (arrow 972). The rising edge on line CLK clocks flip-flop 930, causing output terminal Q0 to return to a logic one (arrow 974). Setting flip-flop 930 prepares flip-flop 930 to respond to a subsequent falling edge. Flip-flop stages 912–918 are similarly reset by downstream flip-flop stages via respective feedback terminal DS (for "down stream").

Each flip-flop stage propagates the falling edge until the final output terminal Q8 falls (edge 976). The resulting logic zero on the select terminal S of multiplexer 927 gates the signal on line B, a logic one at this time, to the clear terminal CLR of flip-flop 930 (arrow 978). Flip-flop 930 consequently clears, so that output terminal Q0 returns low (arrow 980). This falling edge then traverses the remaining stages as did the first falling edge on terminal Q0.

Delay circuit 905 and oscillator-enable circuit 910 cycle alternating falling and rising edges as long as both test enable terminals TE and TE1 remain high. As a result, oscillator 900 oscillates, providing periodic signals on each output terminal Q0–Q7. The periods of these signals largely depend upon the enable-to-Q delays of flip-flop stages 912–918 and 930, and can therefore be used to find the average enable-to-Q delays for flip-flop 930 and the flip-flops within each flip-flop stage 912–918. FIG. 9A depicts flip-flop 930 as part of oscillator-enable circuit 910. However, the clear-to-Q delay of flip-flop 930 contributes to the period of oscillator 900, and can therefore be considered a component of delay circuit 205.

In the depicted embodiment, the oscillating signal on output terminal Q0 is conveyed via a buffer 941 to an output line OSC for measurement. Measuring the period of an oscillating signal can be accomplished in many ways, as is well understood by those of skill in the art.

FIG. 10A depicts an oscillator 1000 that can be used in accordance with the invention to measure the time required for a preset signal to affect a change on the output terminal of a flip-flop. Hereafter, this delay is referred to as the "preset-to-Q delay."

Oscillator 1000 includes a delay circuit 1005 and an oscillator-enable circuit 1010. Delay circuit 1005 includes seven flip-flop stages 1012–1018. Oscillator-enable circuit 1010 includes four AND gates 1020–1023, an OR gate 1025, a multiplexer 1027, and a pair of D flip-flops 1029 and 1030. Flip-flop 1012, as depicted in FIG. 10B, includes a pair of AND gates 1032 and 1034, an OR gate 1036, and a flip-flop 1040. The remaining flip-flop stages 1013–1018 are identical.

Oscillator 1000 has two test-enable lines TE and TE1 similar to like-named terminals of FIGS. 8A and 9A. Both test enable lines TE and TE1 are brought high to initiate oscillation. Oscillator 1000 additionally includes an initialization line XINIT that, when asserted, initializes each memory element in oscillator 1000 to logic zero. Flip-flop 1029 is initialized to zero by asserting the XINIT signal on clear terminal CLR; the remaining flip-flops in stages 1012–1018 are initialized to zero by presenting a rising clock edge with their respective D input terminals tied to ground (logic zero).

With all the flip-flops initialized to logic zero, oscillator-enable circuit 1010 produces a rising edge on terminal Q0 by asserting a present signal on line PRE of flip-flop 1030. The rising edge on output terminal Q0 then traverses flip-flop stages 1012–1018, presetting each flip-flop within stages 1012–1018 in the process. Once through the last flip-flop 1018, the rising edge feeds back to the first stage 1012 to induce another cycle. Flip-flop 1030 and flip-flop stages 1012–1018 thus form a ring oscillator, oscillator 1000. The period of oscillator 1000 depends upon the preset-to-Q delay of flip-flop 1030 and each flip-flop stage 1012–1018. Consequently, the period of oscillator 1000 can be used to measure the preset-to-Q delay of those elements.

Oscillator 1000 is similar to oscillator 900 of FIGS. 9A, 9B, and 9C. A detailed description of oscillator 1000 is therefore omitted for brevity.

The timing of each of the foregoing delay elements and oscillators depends on the delay of interest for the selected type of memory cell and also upon the related interconnect and logic. Accurately determining the delay of interest is therefore somewhat more complex than simply dividing a given delay by the number of memory element in the delay path. There are generally two approaches. The first, outlined above in connection with FIG. 7, compares the timing of a delay circuit or oscillator that includes a memory cell of interest with a nearly identical circuit without the memory cell. The delay difference between the two circuits is then presumed to be the contribution of the memory cell of interest. The second approach assigns each circuit element, or "primitive," in a number of different circuit configurations a different timing variable. The clock-to-Q delay of a particular memory element might be assigned one variable, while a certain buffer might be assigned another, for example. A series of equations can then be created by combining the delays associated with the various primitives in the different circuit configurations. The equations are then solved and the results compared with the measuring timing values for the circuits that the equations are intended to simulate. Then, in a process commonly known as "back annotation," well-known mathematical principles are used to adjust the assigned timing variables for the various primitives to minimize the difference between actual measured data and simulated data gathered using the assigned variables. For a detailed discussion of one method for back-annotating timing constraints onto logic simulation models of integrated circuits, see U.S. Pat. No. 5,581,738, entitled "Method and Apparatus for Back-Annotating Timing Constraints into Simulation Models of Field Programmable Gate Arrays," by Peter F. Dombrowski, issued Dec. 3, 1996, and incorporated herein by reference.

All of the circuits described in connection with FIGS. 2 through 14 can be implemented in programmable logic devices, such as one of the XC4000 series of FPGAs available from Xilinx, Inc., of San Jose, Calif. Devices, software, and methods used to accomplish general logic implementations are commercially available from Xilinx, Inc., and are well known to those of skill in the art. See, for example, "The Programmable Logic Data Book," (1998) pp. 4–5 to 4–40, available from Xilinx, Inc., which are incorporated herein by reference.

Figure 1:
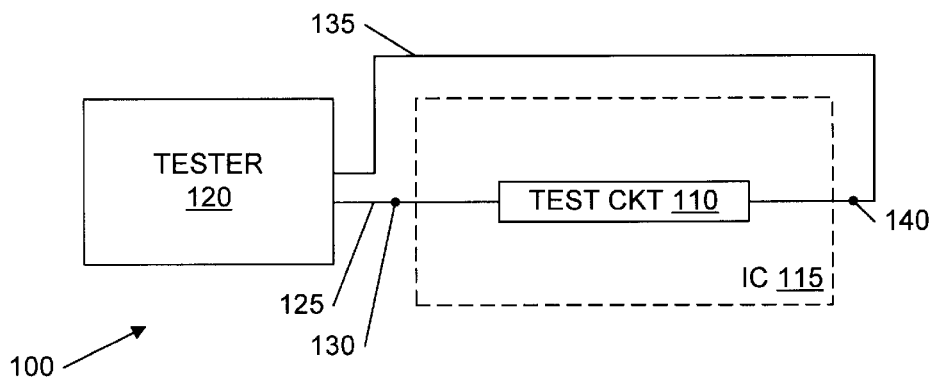
FIG. 1 depicts a conventional test configuration 100 for determining the signal propagation delay of a test circuit 110 in a conventional IC 115.

While the present invention has been described in connection with specific embodiments, variations of these embodiments will be obvious to those of ordinary skill in the art. For example, the invention may be applied to types of memory cells not illustrated above. Moreover, delay circuits 805, 905, and 1005 can be used in conventional test configurations, such as in place of test circuit 110 in test configuration 100 of FIG. 1. Therefore, the spirit and scope of the appended claims should not be limited to the foregoing description.

What is claimed is:

1. A delay circuit adapted to receive a signal transition on a delay-circuit input node and to provide a delayed version of the signal transition on a delay-circuit output node, the delay circuit comprising:
   a. an upstream memory element having:
      i. an upstream asynchronous input terminal connected to the delay-circuit input node; and
      ii. an upstream output terminal; and
   b. a downstream memory element having:
      i. a downstream asynchronous input terminal connected to the upstream output terminal; and
      ii. a downstream output terminal connected to the delay-circuit output node.

2. The delay circuit of claim 1, further comprising at least one additional downstream memory element having:
   a. a second downstream asynchronous input terminal connected to the first-mentioned downstream output terminal; and
   b. a second downstream output terminal connected to the delay-circuit output node;
   c. such that the first-mentioned downstream memory element connects to the delay-circuit output node through the second downstream memory element.

3. The delay circuit of claim 1, wherein at least one of the upstream and downstream memory elements is a flip-flop.

4. The delay circuit of claim 3, wherein the asynchronous input terminal of the flip-flop is a clear terminal.

5. The delay circuit of claim 3, wherein the asynchronous input terminal of the flip-flop is a preset terminal.

6. The delay circuit of claim 3, wherein the asynchronous input terminal of the flip-flop is a clock-enable terminal.

7. The delay circuit of claim 1, wherein at least one of the upstream and downstream memory elements changes from a first memory state to a second memory state in response to the signal transition, and wherein the at least one memory element further includes a return terminal adapted to return the at least one memory element to the first memory state after the at least one memory element changes to the second state.

8. The delay circuit of claim 7, wherein the return terminal connects to the output terminal of the at least one memory element.

9. The delay circuit of claim 8, wherein the return terminal further connects to the output terminal of another of the memory elements situated downstream from the at least one memory element.

10. The delay circuit of claim 7, wherein the return terminal is a clear terminal.

11. The delay circuit of claim 7, wherein the return terminal is a preset terminal.

12. The delay circuit of claim 7, wherein the return terminal is a clock terminal.

13. The delay circuit of claim 1, wherein the delay-circuit output node connects to the delay-circuit input node, thereby forming an oscillator having an oscillation frequency that depends upon a delay imposed by the delay circuit.

14. The delay circuit of claim 13, wherein the delay-circuit output node connects to the delay-circuit input node through an oscillation-enable circuit, wherein the oscillation-enable circuit is adapted to initiate oscillation.

15. The delay circuit of claim 14, wherein the oscillation-enable circuit comprises:
   a. an enable flip-flop having a clock terminal, a synchronous input terminal, an asynchronous input terminal, and an output terminal, the enable flip-flop receiving a test-enable signal on the synchronous input terminal; and
   b. a logic circuit receiving the test-enable signal, an output signal from the enable flip-flop output terminal, and a signal from the downstream memory cell.

* * * * *